United States Patent [19]

Wieser

[11] Patent Number: 4,736,117

[45] Date of Patent: Apr. 5, 1988

[54] VDS CLAMP FOR LIMITING IMPACT IONIZATION IN HIGH DENSITY CMOS DEVICES

[75] Inventor: James B. Wieser, Union City, Calif.

[73] Assignee: National Semiconductor Corporation, Santa Clara, Calif.

[21] Appl. No.: 930,869

[22] Filed: Nov. 14, 1986

[51] Int. Cl.[4] .......................................... H03K 17/16
[52] U.S. Cl. ................... 307/200 B; 307/448; 307/451; 307/497; 307/568; 307/579; 307/585; 330/253
[58] Field of Search ................ 307/200 B, 443, 448, 307/450, 451, 482, 520–521, 540, 552, 568, 240, 246, 571, 575–579, 584–585, 304, 496–497; 330/107, 253, 294; 333/173

[56] References Cited

U.S. PATENT DOCUMENTS

| 4,069,430 | 1/1978 | Masuda | 307/450 X |
| 4,317,055 | 2/1982 | Yoshida et al. | 307/584 X |
| 4,484,089 | 11/1984 | Viswanathan | 333/173 X |
| 4,490,629 | 12/1984 | Barlow et al. | 307/451 |
| 4,508,978 | 4/1985 | Reddy | 307/578 X |
| 4,508,982 | 4/1985 | Kapral et al. | 333/173 X |
| 4,633,425 | 12/1986 | Senderowicz | 333/173 X |

FOREIGN PATENT DOCUMENTS

| 0015343 | 9/1980 | European Pat. Off. | 333/173 |
| 0190027 | 8/1986 | European Pat. Off. | 307/451 |

Primary Examiner—Stanley D. Miller
Assistant Examiner—D. R. Hudspeth
Attorney, Agent, or Firm—Limbach, Limbach & Sutton

[57] ABSTRACT

A circuit for controlling drain-to-source voltage in an MOS transistor. A second MOS transistor is located in series with the first transistor. The gate voltage of the second transistor is such that the drain-to-source voltages of both transistors are substantially equal.

2 Claims, 3 Drawing Sheets

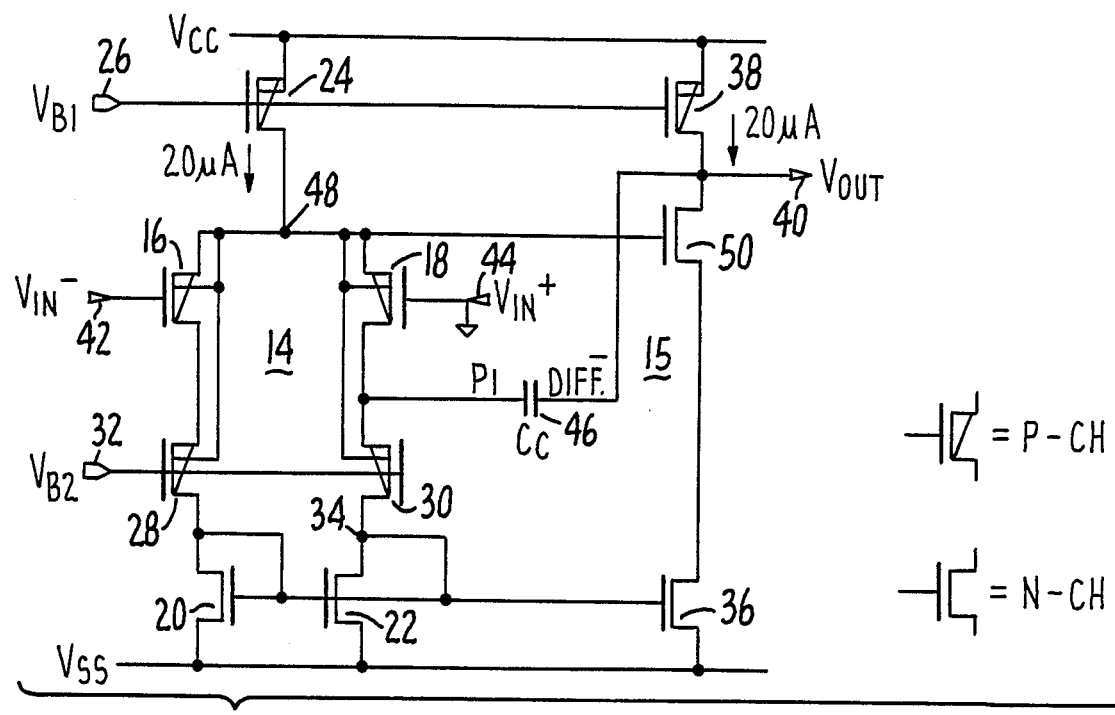
FIG. 4.
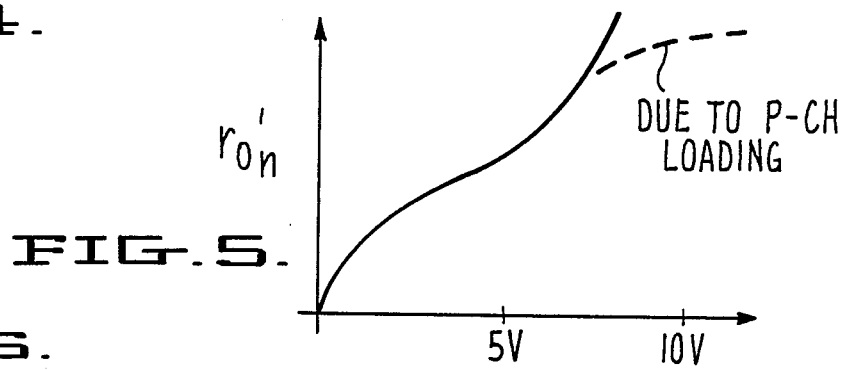
FIG. 5.
FIG. 6.
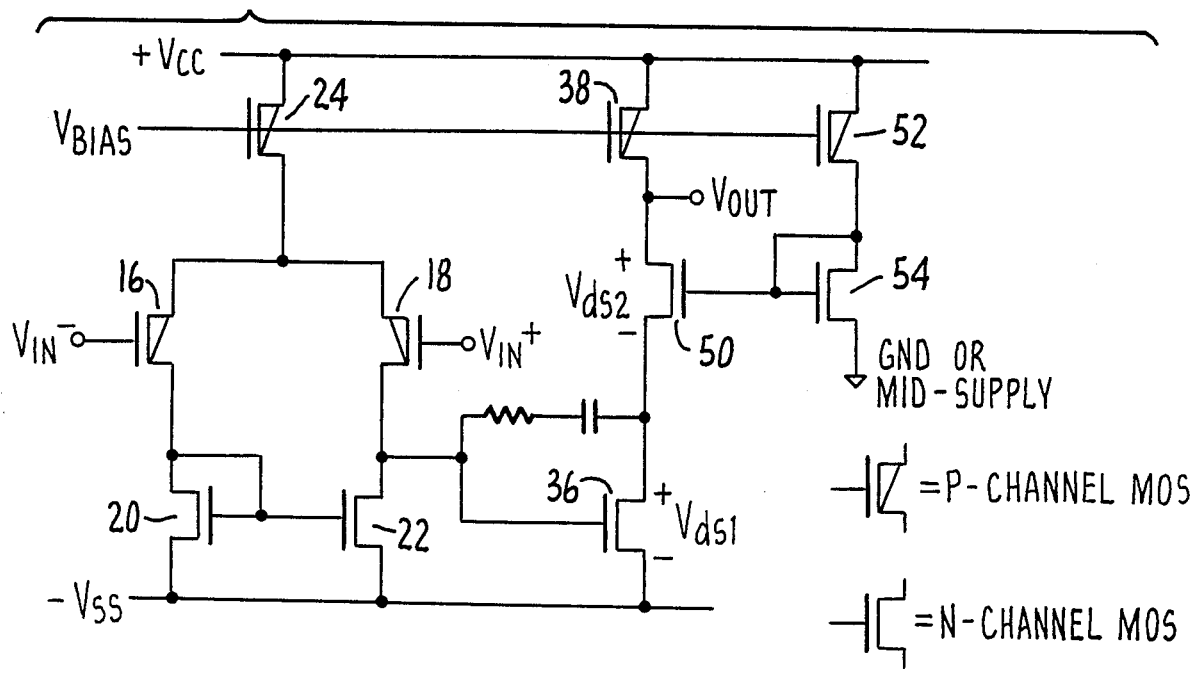

4,736,117

VDS CLAMP FOR LIMITING IMPACT IONIZATION IN HIGH DENSITY CMOS DEVICES

BACKGROUND OF THE INVENTION

1. Field of the Invention

The present invention relates to complimentary metal oxide semiconductor (CMOS) devices and, in particular, to a technique for eliminating impact ionization in high density CMOS circuit configurations allowing higher supplies and, thus, greater dynamic range.

2. Discussion of the Prior Art

While the advancement of CMOS technology has resulted in high density processes, a major limitation on the technology has been the allowable drain-to-source voltage ($V_{ds}$) for n-type MOS transistors. The limitation, typically 5V, is due to shallow/sharp junctions and thin gate oxides which result in impact ionization.

Impact ionization is a phenomenon that occurs primarily in n-channel mos devices. When the supply voltage is increased above 5V to the point where the allowable $V_{ds}$ of the device is exceeded, electron mobility is such that collisions occur at the drain. These collisions ionize the semiconductor crystal and create electron-/hole pairs. As illustrated in FIGS. 1A–1C, when this occurs, the drain-to-substrate current increases above normal leakage to contribute to the total drain current. This not only damages the device, but also reduces the output impedance for saturated device applications.

The above-stated problem limits supplies to 5V and, thus, reduces the maximum possible dynamic range for CMOS analog circuits. If this effect can be eliminated, higher dynamic ranges can be achieved. This would permit the higher density CMOS processes required for digital applications to be integrated with high dynamic range CMOS analog circuitry, taking full advantage of the advancements in the technology.

SUMMARY OF THE INVENTION

The present invention provides a simple, yet effective solution to the impact ionization problem described above. According to the present invention, a second MOS device with a fixed gate voltage is added in series with the effected MOS device such that $V_{ds}$ is equally divided across the two devices. This configuration eliminates impact ionization, permitting higher voltage swings and preserving high output impedance and, thus, allowing high gain for an amplifier or high impedance for a current source. Clamping $V_{ds}$ at mid-supply has minimal effect on circuit performance at low $V_{ds}$ and is very inexpensive to implement. The technique allows twice the dynamic range that would normally be possible if the technique were not used. The invention applies to any CMOS process at any voltage and can be extended to any number of subdivisions of supply. The invention applies to both analog and digital circuits.

Other objects, features and advantages of the present invention will become apparent and be appreciated by referring to the detailed description provided below which should be considered in conjunction with the accompanying drawings.

DESCRIPTION OF THE DRAWINGS

FIG. 4 is a schematic diagram illustrating use of the $V_{ds}$ clamping technique of the present invention in a switched capacitor filter amplifier.

FIG. 5 is a graph illustrating output impedance versus supply for the switched-capacitor filter amplifier shown in FIG. 4.

FIG. 6 is a circuit schematic illustrating an alternative embodiment of the $V_{ds}$ clamping technique of the present invention.

DETAILED DESCRIPTION OF THE PREFERRED EMBODIMENT

Figure 1A:
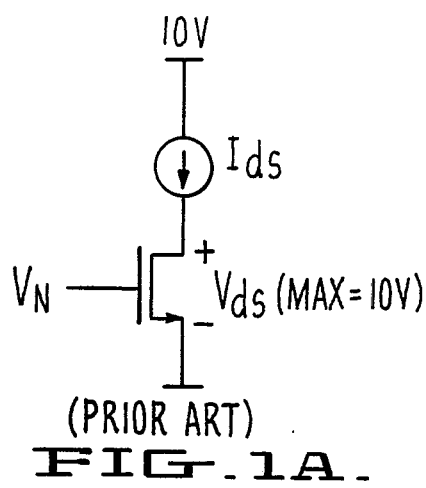
FIG. 1A is a simple circuit schematic illustrating a conventional n-channel device having a 10V supply.
Figure 1B:
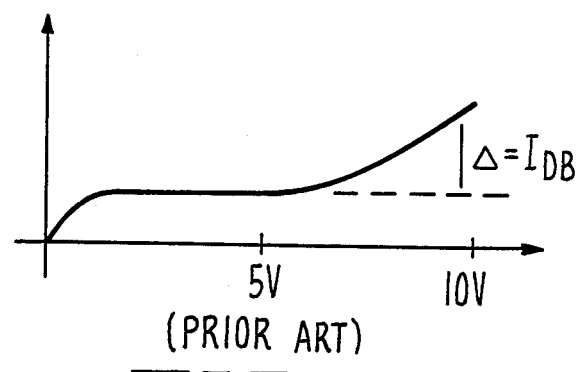
FIG. 1B is a graph illustrating the drain-to-source current of the conventional n-channel device shown in FIG. 1A for increasing supply.
Figure 1C:
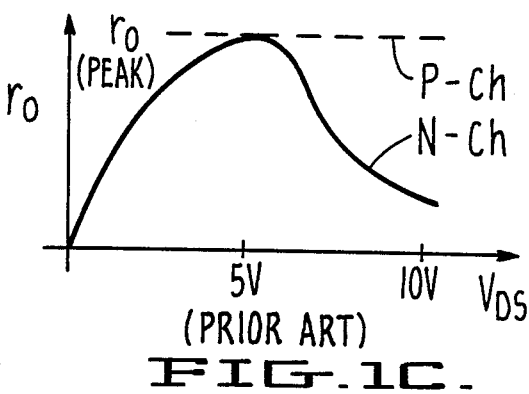
FIG. 1C is a graph illustrating the relationship between output impedance and drain-to-source voltage for a conventional n-channel device.
Figure 2A:
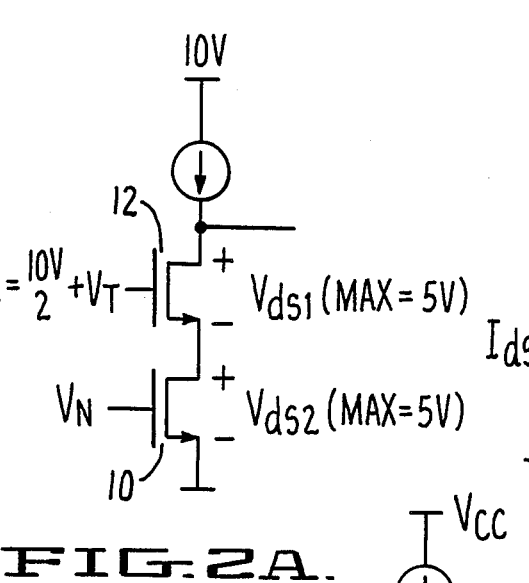
FIG. 2A is a simple circuit schematic illustrating the $V_{ds}$ clamping technique of the present invention.
Figure 2B:
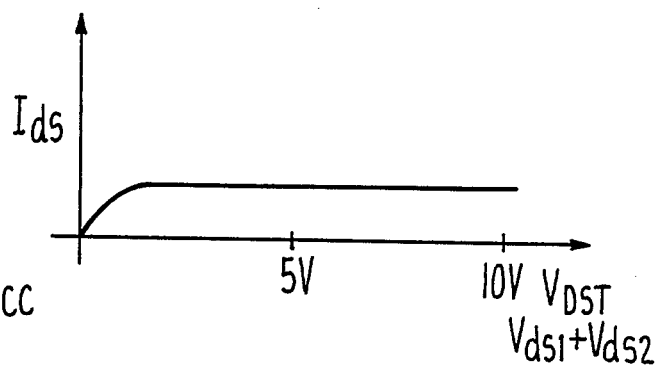
FIG. 2B is a graph illustrating the drain-to-source current of the circuit shown in FIG. 2A for increasing supply.

FIG. 2A illustrates the general concept of the present invention. A first n-channel device 10 having a gate voltage $V_N$ is configured in series with a second n-channel device 12. In accordance with the present invention, the gate voltage $V_G$ of n-channel device 12 is fixed such that $$V_G = \frac{10\text{ V}}{2} + V_T \quad (1)$$

where $V_T$ is the threshold voltage of device 12. As shown in FIG. 2A, the supply is $10_V$.

Thus, the gate voltage $V_G$ of device 12 is fixed such that, for high supply swings, $V_{ds}$ is divided equally between devices 10 and 12. This allows 10V operation, while limiting $V_{ds}$ to a maximum 5V for each device. When $V_{ds}$ falls below 5V, device 12 is in the linear mode and acts simply as a series resistance having minimal effect on circuit operation. When $V_{ds}$ is greater than 5V, device 12 is in the saturated mode acting as a typical cascode current source, but clamping $V_{ds}$ to 5V.

Figure 3:
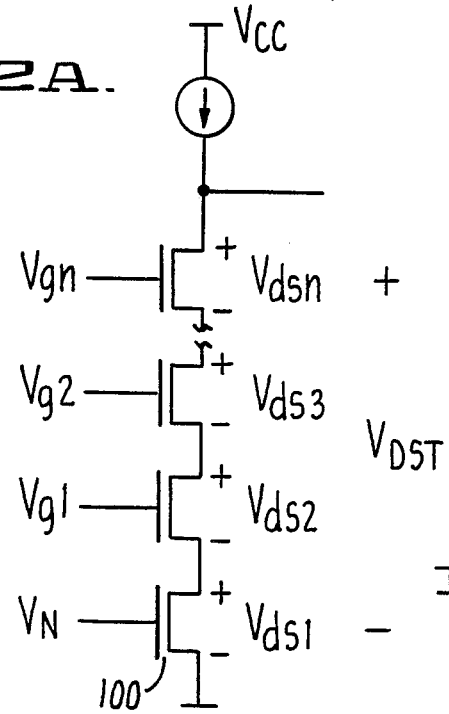
FIG. 3 is a simple circuit schematic illustrating multiple subdivisions of $V_{ds}$ in accordance with the present invention.

As shown in FIG. 3, this concept can be extended to further subdivide the supply. In the circuit shown in FIG. 3, n-channel device 100 having gate voltage $V_N$ is configured in series with a plurality of MOS devices 1–n. Each of the devices 1-n has a fixed voltage applied to its gate such that the drain-to-source voltages of the device 100 and each of the devices 1-n are substantially equal, i.e. $V_{ds1} = V_{ds2} = V_{ds3} = V_{dsn}$. However, this is done at more cost and has more effect on circuit performance. The degree to which the supply can be subdivided is limited ultimately by other process breakdown mechanisms such as, for example, field threshold and punch-through.

A primary application of the present invention is to allow 10V operation of a switched capacitor filter integrated with high density digital logic in a high density CMOS process.

The main building block of a switched capacitor filter is an integrator which uses an operational amplifier with common mode always near mid-supply. Thus, this common source of the differential pair of the op amp can be used in accordance with the present invention to provide the substantially fixed gate voltage $V_G$ for the $V_{ds}$ clamping device.

FIG. 4 shows a CMOS switched capacitor filter amplifier circuit which utilizes the present invention.

With reference to FIG. 4, a power supply is connected between the $V_{SS}$ terminal and the VCC terminal. Two stages are shown. Input stage 14 is composed of a differential transistor pair of p-channel devices 16 and 18, current mirror load n-channel transistors 20 and 22, and a p-channel tail current sink 24. Transistor 24 is conventionally biased on a potential $V_{B1}$ applied to terminal 26 where $V_{B1}$ is normally biased slightly over one p-channel transistor threshold below $V_{CC}$.

Input stage 14 is of cascode construction. Common gate p-channel load transistors 28 and 30 are coupled in series with the drains of transistors 16 and 18, respectively. The gates of transistors 28 and 30 are returned to potential $V_{B2}$ at terminal 32. $V_{B2}$ is selected to be intermediate between $V_{SS}$ and ground so that transistors 28 and 30 will be normally biased in their saturated region of operation so that their combined conduction equals the tail current flowing in transistor 24.

The input stage provides a single-ended output at node 34 which is directly coupled to inverting amplifier stage 15. This stage is composed of an n-channel driver 36 and a p-channel current sink 38 which together form the inverting amplifier. Current sink 38 is biased in parallel with tail current sink 24. Using the configuration shown, output terminal 40 will respond at high gain to differential input signals applied across inverting input terminal 42 and non-inverting input terminal 44.

Frequency compensation capacitor 46 is coupled between output terminal 40 and the source of transistor 30 which, acting as a common gate amplifier, couples the capacitor back to node 34. Transistor 28 acts to balance the characteristics of input stage 14.

Transistor 30 acts as a voltage-controlled current source feeding back a frequency-dependent current to node 34 while isolating and not loading the node.

The common source node 48 of the differential pair comprising transistors 16 and 18 is always near midsupply plus one p-channel threshold. Therefore, in accordance with the present invention, node 48 is connected to provide a substantially fixed gate voltage for clamping device 50. Thus, $V_{ds}$ is divided equally across devices 50 and 36, as described above.

Clamping transistor 50 is the only additional device needed to be added to a conventional switched capacitor filter amplifier to allow higher voltage operation. For best performance, device 50 should have higher W/L than transistor 36. This is easily accomplished in lay-out by making the W's the same and $L_{50}$ less than $L_{36}$. From a lay-out standpoint, the one extra device adds little to total area.

Clamping device 50 has minimal effect on circuit performance at low $V_{ds}$ and is very cheap to implement. It allows twice the dynamic range that would normally be possible if the technique of the present invention were not used.

FIG. 5 illustrates output impedance versus supply for the above-described switched capacitor filter amplifier.

FIG. 6 shows an alternative implementation of the present invention with wide common-mode-range input and large swing output. Where similar parts are employed, the numbers of FIG. 4 are used. In this embodiment, since the common source node is allowed to swing, transistor 50 is biased by a fixed voltage provided by an additional bias string comprising devices 52 and 54. This embodiment provides the best bias since it can be custom tailored to split supply; however, it results in increased costs, power and area.

Figure 7:
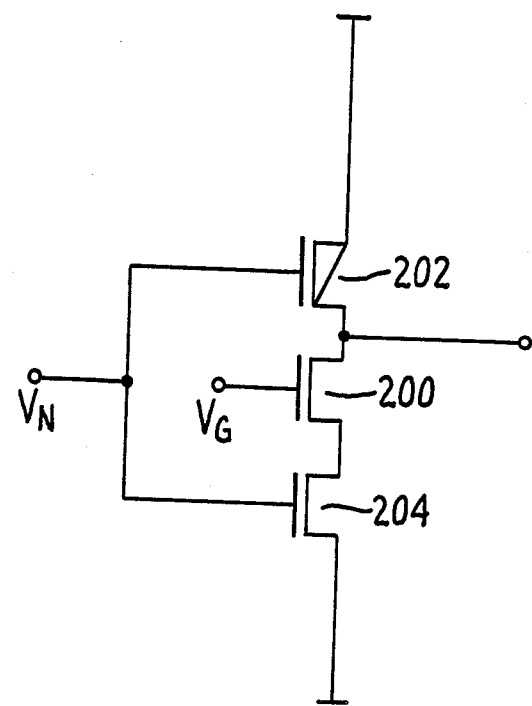
FIG. 7 is a simple circuit schematic illustrating a digital circuit embodiment of the $V_{ds}$ clamping technique of the present invention.

While the present invention has thus far been described in the context of analog circuitry, it is also applicable to digital circuits. FIG. 7 illustrates a simple digital circuit wherein a fixed bias voltage $V_G$ is applied to the gate of clamping transistor 200 which is located in series with two transistors 202, 204 forming an inverter. In this manner, the drain-to-source voltage $V_{ds}$ of each of the two transistors 200, 204 is maintained substantially equal, at high swing.

Although impact ionization is not normally observed on p-channel devices due to lower electron mobility, the technique of the present invention could be applied to p-channel devices as well.

It should be understood that various alternatives to the embodiment described herein may be employed in practicing the present invention. It is intended that the following claims define the invention and that circuits within the scope of these claims and their equivalents be covered thereby.

What is claimed is:

1. In a switched capacitor filter amplifier of the type that includes
   (a) a power supply for generating a first voltage and a second voltage;
   (b) an input stage including
      (i) a differential transistor pair having source elements connected to a common node which is at a substantially fixed voltage,
      (ii) a current mirror,
      (iii) a pair of common gate load transistors coupled in series between the respective drains of the differential transistor pair and the current mirror, the gates of the load transistors having a bias potential applied thereto; and
   (c) an inverting amplifier stage which receives a single-ended output from the input stage, the inverting amplifier stage including
      (i) a driver transistor connected to the power supply, and
      (ii) a current sink biased in parallel with a tail current sink for the differential transistor pair,
the improvement comprising a clamping transistor located in series with the driver transistor and having its gate connected to the common node of the differential transistor pair such that the drain-to-source voltages of the driver transistor and the clamping transistor are substantially equal.

2. The switched capacitor filter amplifier according to claim 1 wherein the fixed voltage is midway between the first voltage and the second voltage.

* * * * *